US012199021B2

(12) United States Patent
Noderer et al.

(10) Patent No.: US 12,199,021 B2
(45) Date of Patent: Jan. 14, 2025

(54) POWER SEMICONDUCTOR MODULE AND METHOD FOR PRODUCING A POWER SEMICONDUCTOR MODULE

(71) Applicant: SEMIKRON ELEKTRONIK GMBH & CO. KG, Nuremberg (DE)

(72) Inventors: Manuel Noderer, Nuremberg (DE); Alexander Wehner, Nuremberg (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 551 days.

(21) Appl. No.: 17/693,319

(22) Filed: Mar. 12, 2022

(65) Prior Publication Data

US 2022/0301998 A1 Sep. 22, 2022

(30) Foreign Application Priority Data

Mar. 22, 2021 (DE) ..................... 10 2021 106 991.2

(51) Int. Cl.
*H01L 23/498* (2006.01)
*H01L 21/48* (2006.01)
*H01L 23/40* (2006.01)
*H01R 4/30* (2006.01)
(Continued)

(52) U.S. Cl.
CPC .... *H01L 23/49811* (2013.01); *H01L 21/4853* (2013.01); *H01L 21/4875* (2013.01); *H01L 23/4006* (2013.01); *H01R 4/30* (2013.01); *H01R 12/51* (2013.01); *H02M 3/003* (2021.05);
(Continued)

(58) Field of Classification Search
CPC ........... H01L 23/49811; H01L 21/4853; H01L 21/4875
See application file for complete search history.

(56) References Cited

U.S. PATENT DOCUMENTS

2021/0336552 A1* 10/2021 Bogen ...................... H01R 4/34
2024/0170418 A1* 5/2024 Ma ...................... H01L 23/5384

FOREIGN PATENT DOCUMENTS

DE 102013103116 B3 9/2014
DE 102017109706 B3 8/2018

OTHER PUBLICATIONS

DE 10 2021 106 991.2, German Office Action dated Nov. 4, 2021, 3 pages—German, 1 page—English.

* cited by examiner

*Primary Examiner* — Adolf D Berhane
*Assistant Examiner* — Afework S Demisse
(74) *Attorney, Agent, or Firm* — Andrew F. Young; Nolte Lackenbach Siegel

(57) ABSTRACT

A power semiconductor module includes a substrate, having power semiconductor components, further including a housing element, and having a DC voltage connection device having a flat lead connection device and a second flat lead connection element, wherein the flat lead connection device has a first flat lead connection element encased by a plastic element of the flat lead connection device and materially bonded to the plastic element, wherein a connection section of the first flat lead connection element projects from the plastic element, a connection section of the second flat lead connection element is arranged on the plastic element or is at least partly enclosed by the plastic element and bonded to the plastic element so that a section of the plastic element is between the first flat lead connection element and the connection section of the second flat lead connection element.

15 Claims, 4 Drawing Sheets

(51) Int. Cl.
*H01R 12/51* (2011.01)
*H02M 3/00* (2006.01)
(52) U.S. Cl.
CPC ............ *H01L 2023/4031* (2013.01); *H01L 2023/4087* (2013.01)

POWER SEMICONDUCTOR MODULE AND METHOD FOR PRODUCING A POWER SEMICONDUCTOR MODULE

CROSS REFERENCE TO RELATED APPLICATIONS

This application relates to and claims priority to DE 10 2021 106 991.2 filed Mar. 22, 2021, the entire contents of which are incorporated herein fully by reference.

FIGURE SELECTED FOR PUBLICATION

FIG. 1

BACKGROUND OF THE INVENTION

Field of the Invention

The invention relates to a power semiconductor module and to a method for producing a power semiconductor module.

Description of the Related Art

DE 10 2017 109 706 B3 discloses a power semiconductor module comprising a first and a second flat lead connection element, between which an electrically non-conducting insulation layer is arranged. A housing element of the power semiconductor module forms a bearing for the flat lead connection elements and the insulation layer.

The production of such a power semiconductor module is technically complex since both the necessary exact positioning of the insulation layer (plastic film) with respect to the flat lead connection elements and the exact positioning of the flat lead connection elements and the insulation layer with respect to the housing element of the power semiconductor module are technically complex and are thus an obstacle to efficient production of the power semiconductor module.

ASPECTS AND OBJECTS OF THE INVENTION

It is an object of the invention to provide an efficiently producible power semiconductor module comprising a first and a second flat lead connection element, between which an electrically non-conducting insulation layer is arranged.

This object is achieved by means of a power semiconductor module comprising a substrate, which has an electrically non-conducting insulation layer and a metal layer arranged on the insulation layer and structured to form conductor tracks, comprising power semiconductor components arranged on the metal layer and electrically conductively connected to the metal layer, comprising a housing element, and comprising a DC voltage connection device, which has a flat lead connection device and a second flat lead connection element, wherein the flat lead connection device has a first flat lead connection element encased by a plastic element of the flat lead connection device and materially bonded to the plastic element, wherein a connection section of the first flat lead connection element projects from the plastic element, wherein a connection section of the second flat lead connection element is arranged on the plastic element or is at least partly enclosed by the plastic element and materially bonded to the plastic element in such a way that a section of the plastic element is arranged between the first flat lead connection element and the connection section of the second flat lead connection element, wherein the first and second flat lead connection elements are electrically conductively connected to the structured metal layer, wherein during operation of the power semiconductor module the first flat lead connection element has an electrical first polarity and the second flat lead connection element has an electrical second polarity, wherein the DC voltage connection device is materially bonded to the housing element, wherein at least one part of the connection section of the first flat lead connection element and at least one part of the connection section of the second flat lead connection element are arranged outside the housing element.

It proves to be advantageous if the first flat lead connection element is materially bonded to the plastic element by the first flat lead connection element being materially bonded to the plastic element by injection-moulding technology, in particular being injection-moulded into the plastic element. The power semiconductor module is producible particularly efficiently as a result.

Furthermore, it proves to be advantageous if the housing element is formed from a plastic, and the DC voltage connection device is materially bonded to the housing element by the DC voltage connection device being materially bonded to the housing element by injection-moulding technology, in particular being injection-moulded into the housing element. The power semiconductor module is producible particularly efficiently as a result.

Furthermore, it proves to be advantageous if the DC voltage connection device is materially bonded to the housing element by the plastic element and/or the second flat lead connection element being materially bonded to the housing element. The DC voltage connection device is mechanically stably connected to the housing element as a result.

Furthermore, it proves to be advantageous if the housing element extends laterally around the substrate. The power semiconductor components are protected against contamination as a result.

Furthermore, it proves to be advantageous if the section of the plastic element that is arranged between the first flat lead connection element and the connection section of the second flat lead connection element has a thickness of 150 µm to 1000 µm, in particular of preferably 500 µm to 750 µm. A high electrical insulation strength is achieved as a result.

Furthermore, it proves to be advantageous if the respective flat lead connection element is embodied as a metal film or metal sheet, having a thickness of preferably 300 µm to 2000 µm, in particular of preferably 500 µm to 1500 µm. The DC voltage connection device has a low inductance as a result.

Furthermore, it proves to be advantageous if the DC voltage connection device has a through hole arranged outside the housing element and extending through the DC voltage connection device in the normal direction with respect to that part of the connection section of the first flat lead connection element which is arranged outside the housing element. As a result, the power semiconductor module, and in particular the DC voltage connection device, is connectable to a heat sink or to a baseplate in a simple manner by means of a screw connection.

In this context, it proves to be advantageous if the DC voltage connection device is arranged on a heat sink or on a baseplate and is connected to the heat sink or to the baseplate by means of a screw extending through the through hole. The power semiconductor module, and in particular the DC voltage connection device, is reliably connected to the heat sink or to the baseplate as a result.

Furthermore, said object is achieved by means of a method for producing a power semiconductor module according to the invention, wherein the connection section of the second flat lead connection element is arranged on the plastic element in such a way that a section of the plastic element is arranged between the first flat lead connection element and the connection section of the second flat lead connection element, comprising the following method steps:
a) providing a substrate, which has an electrically non-conducting insulation layer and a metal layer arranged on the insulation layer and structured to form conductor tracks, and power semiconductor components arranged on the metal layer and electrically conductively connected to the metal layer, and a housing element, and a second flat lead connection element,
b) providing a flat lead connection device having a first flat lead connection element encased by a plastic element of the flat lead connection device and materially bonded to the plastic element, wherein a connection section of the first flat lead connection element projects from the plastic element,
c) forming a DC voltage connection device by arranging a connection section of the second flat lead connection element on the plastic element in such a way that a section of the plastic element is arranged between the first flat lead connection element and the connection section of the second flat lead connection element,
d) materially bonding the DC voltage connection device to the housing element in such a way that at least one part of the connection section of the first flat lead connection element and at least one part of the connection section of the second flat lead connection element are arranged outside the housing element,
e) electrically conductively connecting the first and second flat lead connection elements to the structured metal layer in such a way that during operation of the power semiconductor module the first flat lead connection element has an electrical first polarity and the second flat lead connection element has an electrical second polarity.

Furthermore, said object is achieved by means of a method for producing a power semiconductor module according to the invention, wherein the connection section of the second flat lead connection element is at least partly enclosed by the plastic element and is materially bonded to the plastic element in such a way that a section of the plastic element is arranged between the first flat lead connection element and the connection section of the second flat lead connection element, comprising the following method steps:
a) providing a substrate, which has an electrically non-conducting insulation layer and a metal layer arranged on the insulation layer and structured to form conductor tracks, and power semiconductor components arranged on the metal layer and electrically conductively connected to the metal layer, and a housing element,
b) providing a DC voltage connection device having a flat lead connection device and a second flat lead connection element, wherein the flat lead connection device has a first flat lead connection element encased by a plastic element of the flat lead connection device and materially bonded to the plastic element, wherein a connection section of the first flat lead connection element projects from the plastic element, wherein a connection section of the second flat lead connection element is at least partly enclosed by the plastic element and materially bonded to the plastic element in such a way that a section of the plastic element is arranged between the first flat lead connection element and the connection section of the second flat lead connection element,
c) materially bonding the DC voltage connection device to the housing element in such a way that at least one part of the connection section of the first flat lead connection element and at least one part of the connection section of the second flat lead connection element are arranged outside the housing element,
d) electrically conductively connecting the first and second flat lead connection elements to the structured metal layer in such a way that during operation of the power semiconductor module the first flat lead connection element has an electrical first polarity and the second flat lead connection element has an electrical second polarity.

Advantageous embodiments of the methods arise analogously to advantageous embodiments of the power semiconductor module, and vice versa.

Furthermore, what proves to be advantageous is a power electronic arrangement comprising a power semiconductor module according to the invention and comprising a DC voltage busbar system having a first and a second flat lead and an electrically non-conducting insulation layer arranged between the first and second flat leads, wherein the DC voltage busbar system is electrically conductively connected to the DC voltage connection device by means of welding connections.

In this context, it proves to be advantageous that, if the DC voltage connection device has a through hole arranged outside the housing element and extending through the DC voltage connection device in the normal direction with respect to that part of the connection section of the first flat lead connection element which is arranged outside the housing element, an electrically non-conducting insulation sleeve is arranged between the screw and the DC voltage connection device, wherein the insulation sleeve bears on the plastic element of the flat lead connection device.

Furthermore, what proves to be advantageous is a power electronic arrangement comprising a power semiconductor module according to the invention, the DC voltage connection device of which power semiconductor module is arranged on a heat sink or on a baseplate and is connected to the heat sink or to the baseplate by means of a screw extending through the through hole, and comprising a DC voltage busbar system having a first and a second flat lead and an electrically non-conducting insulation layer arranged between the first and second flat leads, wherein the first flat lead has a first flat lead connection and the second flat lead has a second flat lead connection, wherein the first flat lead connection is electrically conductively contacted with the connection section of the first flat lead connection element and the second flat lead connection is electrically conductively contacted with the connection section of the second flat lead connection element by means of a screw connection that is realized with the aid of the screw and presses the first flat lead connection against the connection section of the first flat lead connection element and the second flat lead connection against the connection section of the second flat lead connection element.

In this context, it proves to be advantageous if an electrically non-conducting insulation sleeve is arranged between the screw and the DC voltage connection device, wherein the insulation sleeve bears on the second flat lead connection.

The power semiconductor module according to the invention can thus be electrically conductively connected to the DC voltage busbar system both by means of welding connections and by means of a screw connection, which enables high flexibility of the electrical linking of the power semiconductor module.

The above and other aspects, features, objects, and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
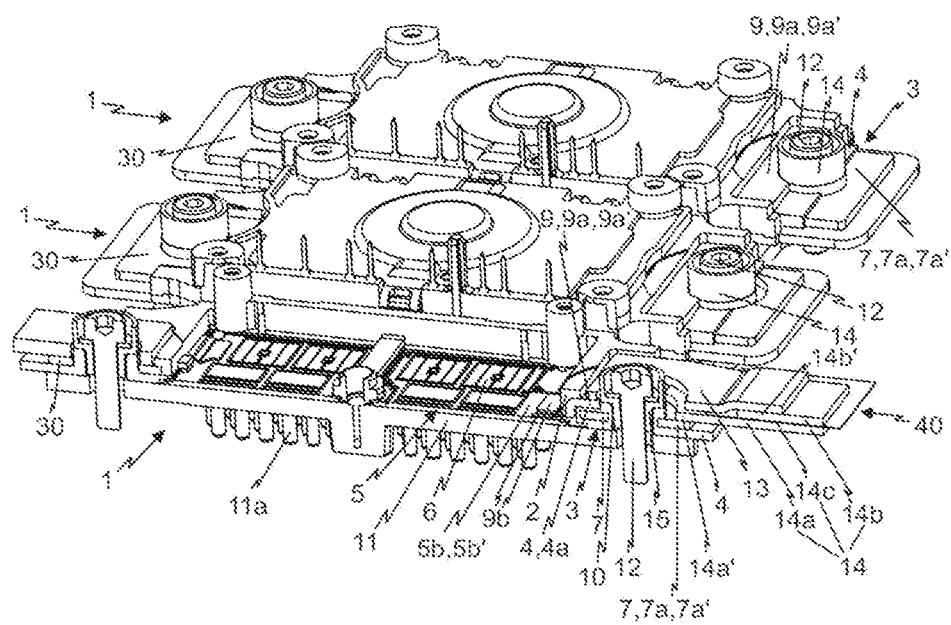
FIG. 1 shows a perspective view of three power semiconductor modules according to the invention arranged next to one another on a heat sink, wherein the frontmost power semiconductor module illustrated in the view is electrically conductively contacted with a DC voltage busbar system by means of welding connections.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner.

It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Figure 2:
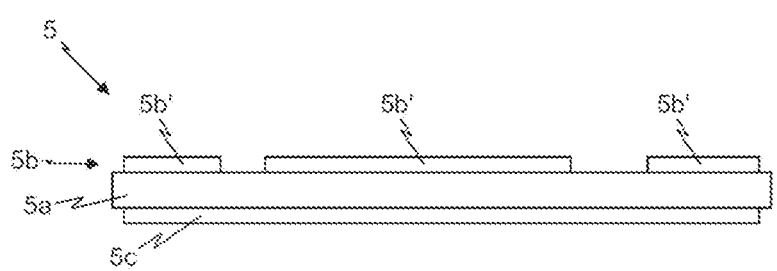
FIG. 2 shows a substrate of a power semiconductor module according to the invention.
Figure 3:
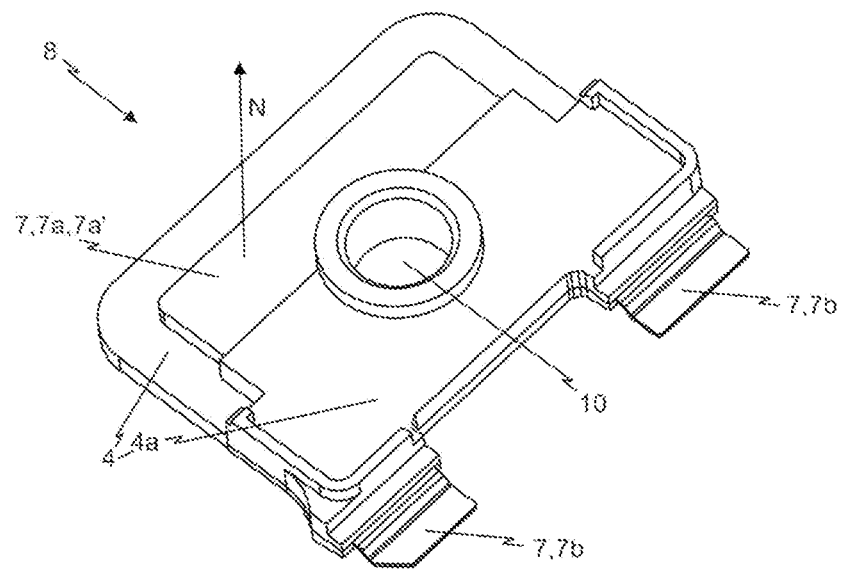
FIG. 3 shows a perspective view of a flat lead connection device of a power semiconductor module according to the invention.
Figure 4:
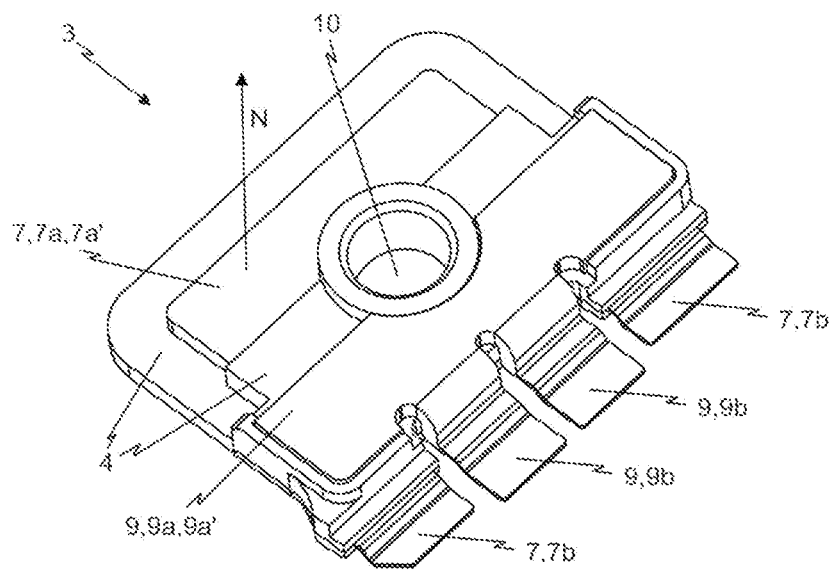
FIG. 4 shows a perspective view of a DC voltage connection device of a power semiconductor module according to the invention.
Figure 5:
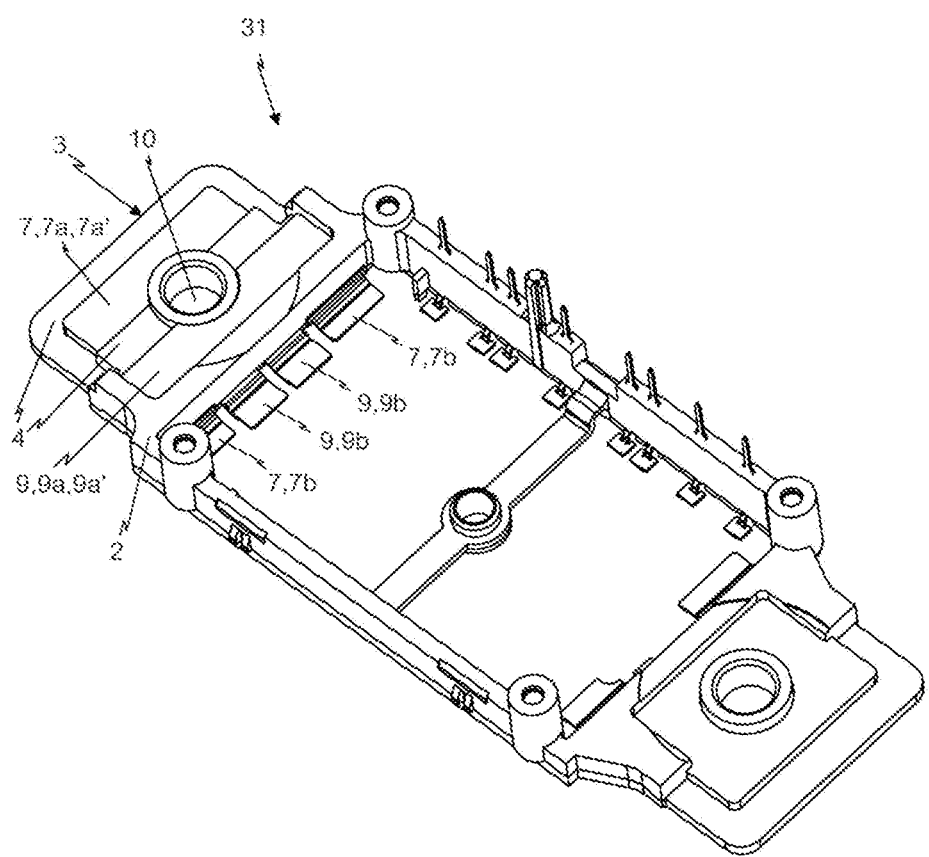
FIG. 5 shows a perspective view of a connection device of a power semiconductor module according to the invention, said connection device having a DC voltage connection device and a housing element of the power semiconductor module according to the invention.
Figure 6:
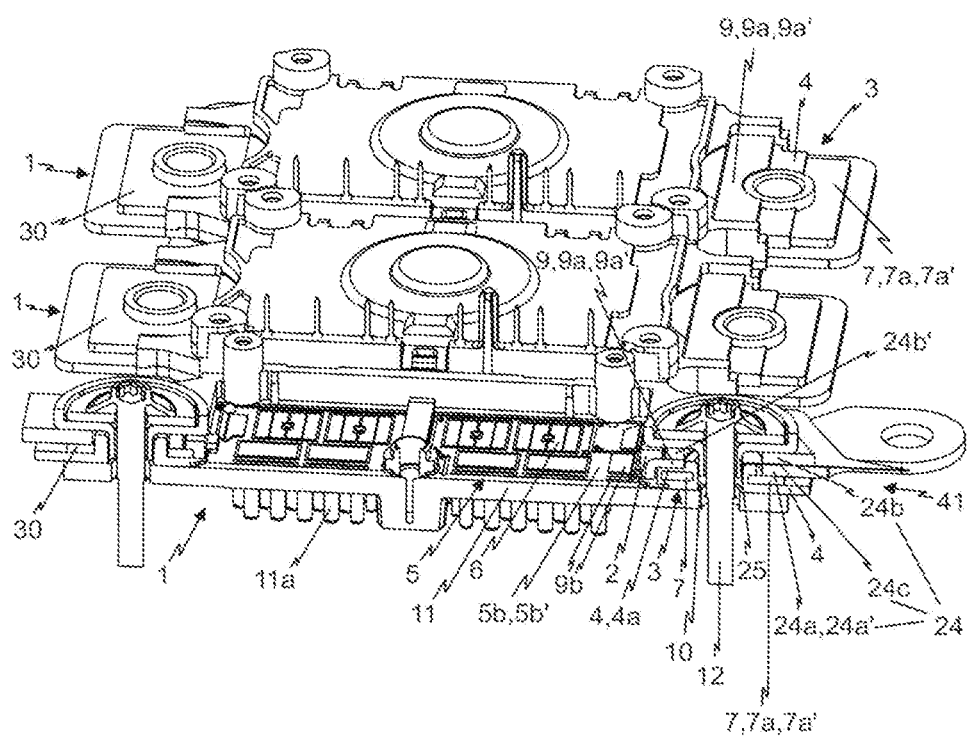
FIG. 6 shows a perspective view of three power semiconductor modules according to the invention arranged next to one another on a heat sink, wherein the frontmost power semiconductor module illustrated in the view is electrically conductively contacted with a DC voltage busbar system by means of a screw connection.

FIG. 1 illustrates a perspective view of three power semiconductor modules 1 according to the invention arranged next to one another on a heat sink 11 illustrated in the frontmost power semiconductor module 1 illustrated in the view is electrically conductively contacted with a DC voltage busbar system 14 by means of welding connections. FIG. 2 illustrates a substrate 5 of the power semiconductor module 1. FIG. 3 illustrates a perspective view of a flat lead connection device 9, and FIG. 4 illustrates a perspective view of a DC voltage connection device 3 of the power semiconductor module 1. FIG. 5 illustrates a perspective view of a connection device 31 of a power semiconductor module 1 according to the invention, said connection device having a DC voltage connection device 3 and a housing element 2. FIG. 6 illustrates a perspective view of three power semiconductor modules 1 according to the invention arranged next to one another on a heat sink 11, wherein the frontmost power semiconductor module 1 illustrated in the view is electrically conductively contacted with a DC voltage busbar system 24 by means of a screw connection.

The power semiconductor module 1 according to the invention has a substrate 5, which has an electrically non-conducting insulation layer 5a and a metal layer 5b arranged on the insulation layer 5a and structured to form conductor tracks 5b'. Preferably, the substrate 5 has an electrically conductive, preferably unstructured further metal layer 5c, wherein the insulation layer 5a is arranged between the metal layer 5b and the further metal layer 5c. The insulation layer 5a can be embodied e.g., as a ceramic plate. The substrate 5 can be embodied e.g., as a Direct Copper Bonded substrate (DCB substrate), as an Active Metal Brazing substrate (AMB substrate) or as an Insulated Metal Substrate (IMS).

The power semiconductor module 1 furthermore has power semiconductor components 6 arranged on the metal layer 5b and electrically conductively connected to the metal layer 5b. The power semiconductor components 6 are preferably electrically conductively contacted with the metal layer 5b by means of a soldering or sintering connection. The respective power semiconductor component 6 is preferably present in the form of a power semiconductor switch or a diode. In this case, the power semiconductor switches 6 are generally present in the form of transistors, such as e.g., IGBTs (Insulated Gate Bipolar Transistor) or MOSFETs (Metal Oxide Semiconductor Field Effect Transistor), or in the form of thyristors.

It should be noted that the power semiconductor components 6, at their side facing away from the substrate 5, by means of e.g., bond wires and/or an electrically conductive film composite, are electrically conductively connected to one another and to the conductor tracks 5b' of the substrate 5, according to the desired electrical circuit, e.g., a half-bridge circuit, which is intended to be realized by the power semiconductor module 1. For the sake for clarity, these electrical connections are not illustrated in FIG. 1 and FIG. 6.

The power semiconductor module 1 furthermore has a housing element 2 and a DC voltage connection device 3 (see FIG. 4) having a flat lead connection device 8 (see FIG. 3) and a second flat lead connection element 9, wherein the flat lead connection device 8 has a first flat lead connection element 7 encased by a plastic element 4 of the flat lead connection device 8 and materially bonded to the plastic element 4. A connection section 7a of the first flat lead connection element 7 projects from the plastic element 4. The flat lead connection device 8 illustrated by way of example in FIG. 3 forms a structural unit. The first flat lead connection element 7 is preferably materially bonded to the plastic element 4 by the first flat lead connection element 7 being materially bonded to the plastic element 4 by injection-moulding technology, in particular being injection-moulded into the plastic element 4. The housing element 2 preferably extends laterally around the substrate 5.

In the context of the exemplary embodiment, as illustrated by way of example in FIG. 1 and FIG. 4, a connection section 9a of the second flat lead connection element 9 is arranged on the plastic element 4 in such a way that a section 4a of the plastic element 4 is arranged between the first flat lead connection element 7 and the connection section 9a of the second flat lead connection element 9.

Alternatively, a connection section 9a of the second flat lead connection element 9 can be at least partly enclosed by the plastic element 4 and materially bonded to the plastic element in such a way that a section 4a of the plastic element 4 is arranged between the first flat lead connection element 7 and the connection section 9a of the second flat lead connection element 9. In this case, the DC voltage connection device 3 forms a structural unit. The second flat lead connection element 9 is preferably materially bonded to the plastic element 4 by the second flat lead connection element 9 being materially bonded to the plastic element 4 by injection-moulding technology, in particular being injection-moulded into the plastic element 4.

The section 4a of the plastic element 4 that is arranged between the first flat lead connection element 7 and the connection section 9a of the second flat lead connection element 9 preferably has a thickness of 150 μm to 1000 μm, in particular of preferably 500 μm to 750 μm.

The plastic element 4 is preferably formed from polyphenylene sulfide or polybutylene terephthalate.

The first and second flat lead connection elements 7 and 9 are electrically conductively connected to the structured metal layer 5b, to put it more precisely in each case to at least one conductor track 5b' of the metal layer 5b, wherein during operation of the power semiconductor module 1 the first flat lead connection element 7 has an electrical first polarity and the second flat lead connection element 9 has an electrical second polarity. The first polarity can be positive and the second polarity negative, or vice versa. The first flat lead connection element 7 is electrically conductively connected to the metal layer 5b, to put it more precisely to at least one conductor track 5b' of the metal layer 5b, via at least one electrically conductive first connecting element 7b. The second flat lead connection element 9 is electrically conductively connected to the metal layer 5b, to put it more precisely to at least one conductor track 5b' of the metal layer 5b, via at least one electrically conductive second connecting element 9b. The respective connecting element 7b or 9b is preferably embodied integrally with the respectively associated flat lead connection element 7 or 9. The respective connecting element 7b or 9b is preferably electrically conductively contacted with the metal layer 5b by means of a welding, soldering, adhesive-bonding or sintering connection. In the context of the exemplary embodiment, the power semiconductor module 1 has a third flat lead connection element 30, which is electrically conductively connected to the metal layer 5b and has an alternating electrical polarity during operation of the power semiconductor module 1.

The respective flat lead connection element 7, 9 or 30 is preferably embodied as a metal film or metal sheet, having a thickness of preferably 300 μm to 2000 μm, in particular of preferably 500 μm to 1500 μm.

The DC voltage connection device 3 is materially bonded to the housing element 4, wherein at least one part 7a' of the connection section 7a of the first flat lead connection element 7 and at least one part 9a' of the connection section 9a of the second flat lead connection element 9 are arranged outside the housing element 2.

By virtue of the fact that the flat lead connection device 8 or the DC voltage connection device 3 forms a structural unit, and the DC voltage connection device 3 is materially bonded to the housing element 4, the power semiconductor module 1 is producible efficiently.

The housing element 2 is preferably formed from a plastic, in particular from polyphenylene sulfide or polybutylene terephthalate, wherein the DC voltage connection device is materially bonded to the housing element 2 by the DC voltage connection device 3 preferably being materially bonded to the housing element 2 by injection-moulding technology, in particular being injection-moulded into the housing element 2.

The DC voltage connection device 3 is materially bonded to the housing element 2 by preferably the plastic element 4 and/or the second flat lead connection element 9 being materially bonded to the housing element 2.

The DC voltage connection device 3 preferably has a through hole 10 arranged outside the housing element 2 and extending through the DC voltage connection device 3 in the normal direction N with respect to that part 7a' of the connection section 7a of the first flat lead connection element 7 which is arranged outside the housing element 2. The DC voltage connection device 3 preferably is arranged on a heat sink 11 or on a baseplate and is connected to the heat sink 11 or to the baseplate by means of a screw 12 extending through the through hole 10. In this case, the substrate 5 is preferably thermally conductively linked to the heat sink 11 or to the baseplate at the side of said substrate facing away from the power semiconductor components 6. The baseplate can be embodied e.g., as a metal plate serving for thermally linking the substrate 5 to a heat sink. The heat sink 11 preferably has cooling fins or cooling studs 11a.

FIG. 1 illustrates by way of example a power electronic arrangement 40 comprising a power semiconductor module 1 and comprising a DC voltage busbar system 14 having a first and a second flat lead 14a and 14b and an electrically non-conducting insulation layer 14c arranged between the first and second flat leads 14a and 14b, wherein the DC voltage busbar system 14 is electrically conductively connected to the DC voltage connection device 3 by means of welding connections. Preferably, an electrically non-conducting insulation sleeve 15 is arranged between the screw 12 and the DC voltage connection device 3, wherein the insulation sleeve 15 bears on the plastic element 4 of the flat lead connection device 8.

FIG. 6 illustrates by way of example a further power electronic arrangement 41 comprising a power semiconductor module 1 and comprising a DC voltage busbar system 24 having a first and a second flat lead 24a and 24b and an electrically non-conducting insulation layer 24c arranged between the first and second flat leads 24a and 24b. The first flat lead 24a has a first flat lead connection 24a' and the second flat lead 24b has a second flat lead connection 24b'. The first flat lead connection 24a' is electrically conductively contacted with the connection section 7a of the first flat lead connection element 7 and the second flat lead connection 24b' is electrically conductively contacted with the connection section 9a of the second flat lead connection element 9 by means of a screw connection that is realized with the aid of the screw 12 and presses the first flat lead connection 24a' against the connection section 7a of the first flat lead connection element 7 and the second flat lead connection 24b' against the connection section 9a of the second flat lead connection element 9. Preferably, an electrically non-conducting insulation sleeve 25 is arranged between the screw 12 and the DC voltage connection device 3, wherein the insulation sleeve 25 bears on the second flat lead connection 24b'.

A method according to the invention for producing a power semiconductor module 1 according to the invention is described hereinafter, wherein the connection section 9a of the second flat lead connection element 9 is arranged on the plastic element 4 in such a way that a section 4a of the plastic element 4 is arranged between the first flat lead connection element 7 and the connection section 9a of the second flat lead connection element 9.

A first method step a) involves providing a substrate 5, which has an electrically non-conducting insulation layer 5a and a metal layer 5b arranged on the insulation layer 5a and structured to form conductor tracks 5b', and power semiconductor components 6 arranged on the metal layer 5b and electrically conductively connected to the metal layer 5b, and a housing element 2, and a second flat lead connection element 9.

A further method step b) involves providing a flat lead connection device 8 (see FIG. 3) having a first flat lead connection element 7 encased by a plastic element 4 of the flat lead connection device 8 and materially bonded to the plastic element 4, wherein a connection section 7a of the first flat lead connection element 7 projects from the plastic element 4. The flat lead connection device 8 thus forms a structural unit.

A further method step c) involves forming a DC voltage connection device 3 (see FIG. 4) by arranging a connection section 9a of the second flat lead connection element 9 on the plastic element 4 in such a way that a section 4a of the plastic element 4 is arranged between the first flat lead connection element 7 and the connection section 9a of the second flat lead connection element 9.

A further method step d) involves materially bonding the DC voltage connection device 3 to the housing element 2 in such a way that at least one part 7a' of the connection section 7a of the first flat lead connection element 7 and at least one part 9a' of the connection section 9a of the second flat lead connection element 9 are arranged outside the housing element 2. The connection device 31 illustrated by way of example in FIG. 5 is formed as the result of method step d).

A further method step e) involves electrically conductively connecting the first and second flat lead connection elements 7 and 9 to the structured metal layer 5a, e.g., by means of soldering, sintering, welding, adhesive bonding, in such a way that during operation of the power semiconductor module 1 the first flat lead connection element 7 has an electrical first polarity and the second flat lead connection element 9 has an electrical second polarity. For this purpose, the at least one electrically conductive first connecting element 7b and the at least one electrically conductive second connecting element 9b are correspondingly electrically conductively connected to the metal layer 5b.

A further method according to the invention for producing a power semiconductor module 1 according to the invention is described hereinafter, wherein the connection section 9a of the second flat lead connection element 9 is at least partly enclosed by the plastic element and is materially bonded to the plastic element in such a way that a section 4a of the plastic element 4 is arranged between the first flat lead connection element 7 and the connection section 9a of the second flat lead connection element 9.

A first method step a) involves providing a substrate 5, which has an electrically non-conducting insulation layer 5a and a metal layer 5b arranged on the insulation layer 5a and structured to form conductor tracks 5b', and power semiconductor components 6 arranged on the metal layer 5b and electrically conductively connected to the metal layer 5b, and a housing element 2.

A further method step b) involves providing a DC voltage connection device 3 (see FIG. 4) having a flat lead connection device 8 and a second flat lead connection element 9, wherein the flat lead connection device 8 has a first flat lead connection element 7 encased by a plastic element 4 of the flat lead connection device 8 and materially bonded to the plastic element 4, wherein a connection section 7a of the first flat lead connection element projects from the plastic element 4, wherein a connection section 9a of the second flat lead connection element 9 is at least partly enclosed by the plastic element and materially bonded to the plastic element in such a way that a section 4a of the plastic element 4 is arranged between the first flat lead connection element 7 and the connection section 9a of the second flat lead connection element 9. The DC voltage connection device 3 thus forms a structural unit.

A further method step c) involves materially bonding the DC voltage connection device 3 to the housing element 2 in such a way that at least one part 7a' of the connection section 7a of the first flat lead connection element 7 and at least one part 9a' of the connection section 9a of the second flat lead connection element 9 are arranged outside the housing element 2. The connection device 31 illustrated by way of example in FIG. 5 is formed as the result of method step c).

A further method step d) involves electrically conductively connecting the first and second flat lead connection elements 7 and 9 to the structured metal layer 5a, e.g., by means of soldering, sintering, welding, adhesive bonding, in such a way that during operation of the power semiconductor module 1 the first flat lead connection element 7 has an electrical first polarity and the second flat lead connection element 9 has an electrical second polarity. For this purpose, the at least one electrically conductive first connecting element 7b and the at least one electrically conductive second connecting element 9b are correspondingly electrically conductively connected to the metal layer 5b.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:
1. A power semiconductor module, comprising:
   a substrate, which has an electrically non-conducting insulation layer and a metal layer arranged on the insulation layer and structured to form conductor tracks;
   power semiconductor components arranged on the metal layer and electrically conductively connected to the metal layer;

a housing element;

a DC voltage connection device which has a first flat lead connection device and a second flat lead connection element, wherein the first flat lead connection device has a first flat lead connection element encased by a plastic element of the first flat lead connection device and is materially bonded to the plastic element;

wherein a connection section of the first flat lead connection element projects from the plastic element;

wherein a connection section of the second flat lead connection element is arranged on the plastic element or is at least partly enclosed by the plastic element and materially bonded to the plastic element in such a way that a section of the plastic element is arranged between the first flat lead connection element and the connection section of the second flat lead connection element;

the first flat lead connection element and the second flat lead connection element are each electrically conductively connected to the structured metal layer;

wherein during operation of the power semiconductor module the first flat lead connection element has an electrical first polarity and the second flat lead connection element has an electrical second polarity; and the DC voltage connection device is materially bonded to the housing element, wherein at least one part of the connection section of the first flat lead connection element and at least one part of the connection section of the second flat lead connection element are arranged outside of the housing element.

2. The power semiconductor module, according to claim 1, wherein:
the first flat lead connection element is materially bonded to the plastic element by injection-moulding into the plastic element.

3. The power semiconductor module, according to claim 1, wherein:
the housing element is formed from a plastic, and the DC voltage connection device is materially bonded to the housing element by injection-moulding into the housing element.

4. The power semiconductor module, according to claim 1, wherein:
the DC voltage connection device is materially bonded to the housing element by the plastic element; and
the second flat lead connection element is materially bonded to the housing element.

5. The power semiconductor module, according to claim 1, wherein:
the housing element extends laterally around the substrate.

6. The power semiconductor module, according to claim 1, wherein:
the section of the plastic element that is arranged between the first flat lead connection element and the connection section of the second flat lead connection element has a thickness of 150 µm to 1000 µm.

7. The power semiconductor module, according to claim 1, wherein:
the respective flat lead connection element is embodied as a metal film or metal sheet, having a thickness of preferably 300 µm to 2000 µm.

8. The power semiconductor module, according to claim 1, wherein:
the DC voltage connection device has a through hole arranged outside the housing element and extending through the DC voltage connection device in the normal direction (N) with respect to the one part of the connection section of the first flat lead connection element which is arranged outside the housing element.

9. The power semiconductor module, according to claim 8, wherein:
the DC voltage connection device is arranged on a heat sink or on a baseplate and is connected to the heat sink by means of a screw extending through the through hole.

10. A method for producing a power semiconductor module, comprising the steps of:
providing a power semiconductor module according to claim 1;
wherein the connection section of the second flat lead connection element is arranged on the plastic element in such a way that a section of the plastic element is arranged between the first flat lead connection element and the connection section of the second flat lead connection element;
providing a substrate, which has an electrically non-conducting insulation layer and a metal layer arranged on the insulation layer and structured to form conductor tracks, and power semiconductor components arranged on the metal layer and electrically conductively connected to the metal layer, and a housing element, and a second flat lead connection element;
providing a flat lead connection device having a first flat lead connection element encased by a plastic element of the flat lead connection device and materially bonded to the plastic element, wherein a connection section of the first flat lead connection element projects from the plastic element;
forming a DC voltage connection device by arranging a connection section of the second flat lead connection element on the plastic element in such a way that a section of the plastic element is arranged between the first flat lead connection element and the connection section of the second flat lead connection element;
materially bonding the DC voltage connection device to the housing element in such a way that at least one part of the connection section of the first flat lead connection element and at least one part of the connection section of the second flat lead connection element are arranged outside the housing element; and
electrically conductively connecting the first and second flat lead connection elements to the structured metal layer in such a way that during operation of the power semiconductor module the first flat lead connection element has an electrical first polarity and the second flat lead connection element has an electrical second polarity.

11. A method for producing a power semiconductor module, comprising the steps of:
providing a power semiconductor module according to claim 1;
wherein the connection section of the second flat lead connection element is at least partly enclosed by the plastic element and is materially bonded to the plastic element in such a way that a section of the plastic element is arranged between the first flat lead connection element and the connection section of the second flat lead connection element;
providing a substrate, which has an electrically non-conducting insulation layer and a metal layer arranged on the insulation layer and structured to form conductor tracks, and power semiconductor components arranged on the metal layer and electrically conductively connected to the metal layer, and a housing element;

providing a DC voltage connection device having a flat lead connection device and a second flat lead connection element, wherein the flat lead connection device has a first flat lead connection element encased by a plastic element of the flat lead connection device and materially bonded to the plastic element, wherein a connection section of the first flat lead connection element projects from the plastic element, wherein a connection section of the second flat lead connection element is at least partly enclosed by the plastic element and materially bonded to the plastic element in such a way that a section of the plastic element is arranged between the first flat lead connection element and the connection section of the second flat lead connection element;

materially bonding the DC voltage connection device to the housing element in such a way that at least one part of the connection section of the first flat lead connection element and at least one part of the connection section of the second flat lead connection element are arranged outside the housing element; and electrically conductively connecting the first and second flat lead connection elements to the structured metal layer in such a way that during operation of the power semiconductor module the first flat lead connection element has an electrical first polarity and the second flat lead connection element has an electrical second polarity.

12. A power electronic arrangement, comprising:

a power semiconductor module according to claim 1;
  the power electronic arrangement, further comprising:
    a DC voltage busbar system having a first and a second flat lead and an electrically non-conducting insulation layer arranged between the first and second flat leads; and
    wherein the DC voltage busbar system is electrically conductively connected to the DC voltage connection device by means of welding connections.

13. The power electronic arrangement, according to claim 12, wherein:

the DC voltage connection device has a through hole arranged outside the housing element and extending through the DC voltage connection device in the normal direction (N) with respect to the one part of the connection section of the first flat lead connection element which is arranged outside the housing element;

wherein the DC voltage connection device is arranged on a heat sink or on a baseplate and is connected to the heat sink by means of a screw extending through the through hole;

wherein an electrically non-conducting insulation sleeve is arranged between the screw and the DC voltage connection device; and wherein the insulation sleeve bears on the plastic element of the flat lead connection device.

14. A power electronic arrangement, comprising:

a power semiconductor module according to claim 1;
  the power electronic arrangement, further comprising:
    the DC voltage connection device has a through hole arranged outside the housing element and extending through the DC voltage connection device in the normal direction (N) with respect to the one part of the connection section of the first flat lead connection element which is arranged outside the housing element;
    wherein the DC voltage connection device is arranged on a heat sink or on a baseplate and is connected to the heat sink by means of a screw extending through the through hole; and
    a DC voltage busbar system having a first flat and a second flat lead and an electrically non-conducting insulation layer arranged between the first flat and second flat leads;
    wherein the first flat lead has a first flat lead connection and the second flat lead has a second flat lead connection;
    wherein the first flat lead connection is electrically conductively contacted with the connection section of the first flat lead connection element and the second flat lead connection is electrically conductively contacted with the connection section of the second flat lead connection element by means of a screw connection that is realized with the aid of the screw and presses the first flat lead connection against the connection section of the first flat lead connection element and the second flat lead connection against the connection section of the second flat lead connection element.

15. The power electronic arrangement, according to claim 14, wherein:

an electrically non-conducting insulation sleeve is arranged between the screw and the DC voltage connection device; and wherein the insulation sleeve bears on the second flat lead connection.

* * * * *